(12) United States Patent
Shim et al.

(10) Patent No.: US 7,557,564 B2
(45) Date of Patent: Jul. 7, 2009

(54) TEST HANDLER COMPRISING AT LEAST ONE OPENING UNIT OPENING ONE PART OF THE PLURALITY OF INSERTS

(75) Inventors: Jae-Gyun Shim, Suwon (KR); Yun-Sung Na, Cheunan (KR); In-Gu Jeon, Suwon (KR); Tae-Hung Ku, Suwon (KR); Jae-Sung Park, Yonin (KR); Su-Myung Lee, Yongin (KR)

(73) Assignee: TechWing Co., Ltd., Hwaseung, Gyeonggi-do (KR)

( * ) Notice: Subject to any disclaimer, the term of this patent is extended or adjusted under 35 U.S.C. 154(b) by 91 days.

(21) Appl. No.: 11/727,851

(22) Filed: Mar. 28, 2007

(65) Prior Publication Data

US 2008/0018354 A1    Jan. 24, 2008

(30) Foreign Application Priority Data

Jul. 20, 2006    (KR) ...................... 10-2006-0068167

(51) Int. Cl.
 *G01R 31/26*    (2006.01)
 *G01R 31/28*    (2006.01)
(52) U.S. Cl. .................................................. 324/158.1
(58) Field of Classification Search ........................ None
 See application file for complete search history.

(56) References Cited

U.S. PATENT DOCUMENTS

| 6,651,817 | B2 | 11/2003 | Shim et al. |
| 6,831,296 | B1 * | 12/2004 | Lee et al. ....................... 257/48 |
| 7,023,197 | B2 * | 4/2006 | Jung ........................ 324/158.1 |
| 2004/0263153 | A1 * | 12/2004 | Boyle et al. .............. 324/158.1 |
| 2008/0298946 | A1 * | 12/2008 | Shim et al. ................ 414/749.1 |

FOREIGN PATENT DOCUMENTS

KR    10-0486412 B1    5/2005

* cited by examiner

*Primary Examiner*—Paresh Patel
(74) *Attorney, Agent, or Firm*—Jefferson IP Law, LLP

(57) ABSTRACT

A test handler is disclosed in the present invention. The test handler may include a test tray on which a plurality of inserts are arrayed for loading at least one semiconductor device, at least one opening unit for simultaneously opening one part of the plurality of inserts which are arrayed on one part of the test tray, and a test tray transfer apparatus for allowing the opening unit to simultaneously open other parts of the plurality of inserts which are arrayed on another part of the test tray as the test tray is transferred. Therefore, although semiconductor devices to be tested change their sizes, the replaced parts of the test handler are reduced in number, thereby reducing manufacturing cost and replacement work time. The inventive test handler reduces semiconductor devices loading time, reduces jamming, increases teaching efficiency and improves space utilization efficiency. Furthermore, the test handler can be applied to various types of testers.

10 Claims, 13 Drawing Sheets

TEST HANDLER COMPRISING AT LEAST ONE OPENING UNIT OPENING ONE PART OF THE PLURALITY OF INSERTS

CROSS-REFERENCE TO RELATED APPLICATIONS

This application claims the benefit under 35 U.S.C. §119 (a) of Korean Patent Application No. 10-2006-0068167, filed on Jul. 20, 2006, in the Korean Intellectual Property Office, the entire disclosure of which is hereby incorporated by reference.

BACKGROUND OF THE INVENTION

1. Field of the Invention

The present invention relates to a test handler, and, more particularly, to a loading part of a test handler for transferring and loading semiconductor devices to a tray.

2. Description of the Related Art

In general, a test handler supports testing of semiconductor devices manufactured by a predetermined manufacturing process, sorts the semiconductor devices into different levels according to the test results, and loads the semiconductor devices onto user trays. Test handlers have been disclosed in many published documents.

FIG. 1 is a schematic perspective view illustrating a conventional test handler 100. The major parts of the conventional test handler 100 will now be briefly described with reference to FIG. 1.

The conventional test handler 100 includes a loading apparatus 110, a soak chamber 120, a test chamber 130, a de-soak chamber 140, an unloading apparatus 150, two insert-opening apparatus 160a and 160b, and two posture changing apparatus 170a and 170b. Each part of the test handler 100 will be described in more detail below.

The loading apparatus 110 transfers and loads semiconductor devices loaded on user trays 10a to a test tray 11a posed at a present loading position.

The soak chamber 120 has a temperature environment for pre-heating/pre-cooling the semiconductor devices loaded on the test tray. The soak chamber 120 sequentially receives the test trays on which the semiconductor devices are loaded by the loading apparatus 110. After the test tray enters the soak chamber 120, the test tray is translated closely toward the test chamber 130 and arranged sequentially with its vertical posture. While translating, the semiconductor devices loaded on the test tray are sufficiently pre-heated/pre-cooled.

The test chamber 130 is installed to the test handler, for testing the semiconductor devices loaded onto two test trays 11b and 11c translated from the soak chamber 120. For this, the test chamber 130 has a temperature environment for testing the semiconductor devices.

The de-soak chamber 140 (or a 'restoring chamber') restores the heated or cooled semiconductor devices to normal temperature.

The unloading apparatus 150 sorts the semiconductor devices loaded on the test tray outputted from the de-soak chamber 140 into different levels, and transfers and loads (an unloading step) the semiconductor devices onto a user tray 10b.

Here, the loading apparatus 110 or the unloading apparatus 150 includes at least one pick and place apparatus (not shown) for adsorbing and withdrawing the semiconductor devices loaded on the user trays or the test tray, and for supplying the semiconductor devices to the user trays or the test tray. For example, the pick and place apparatus adsorbs and withdraws the semiconductor devices from the user tray and then supplies them to the test tray in a loading operation. The pick and place apparatus adsorbs and withdraws the semiconductor devices from the test tray and then supplies them to a sorting table (not shown), or from the sorting table to the user trays in an unloading operation.

On the other hand, the two insert-opening apparatus 160a and 160b open inserts arrayed as a matrix-form on the test trays 11a and 11b correspondingly situated above their upper sides, respectively, such that the loading apparatus 110 or unloading apparatus 150 can perform loading or unloading, respectively.

The posture changing apparatus 170a changes the horizontal posture of the test tray 11a to the vertical posture thereof. The posture changing apparatus 170b changes the vertical posture of the test tray translated from the de-soak chamber 140 to the horizontal posture thereof.

The following is a more detailed description for the posture changing of the test tray in the test handler 100.

Firstly, an empty test tray like a test tray 11a is situated at the lower side of the loading apparatus 110. After semiconductor devices are loaded on the empty test tray (and becomes a test tray), the test tray is transferred to the posture changing apparatus 170a sited at the back side of the loading apparatus 110, and then posture-changed. Thereafter, the test tray is translated to the backside of the soak chamber 120 and then enters the test chamber 130. The test tray is horizontally transferred in two rows (or one row), upper and lower, in the test chamber 130. Here, the semiconductor devices on the test tray are tested by a tester (not shown) located at the middle portion of the test chamber 130. After being forwardly translated through the de-soak chamber 140, the test tray of the vertical posture is supplied to the posture changing apparatus 170b located at the backside of the unloading apparatus 150. The posture changing apparatus 170b changes the vertical posture of the test tray to the horizontal posture. The horizontally posture-changed test tray is transferred to the unloading apparatus 150 to unload the semiconductor devices. After unloading, the test tray is transferred to the lower direction of the loading apparatus 110. As such, the test tray performs sequentially the above-described procedure to test the semiconductor devices loaded thereon.

After loading the semiconductor devices onto the inserts arrayed in a matrix-form, the test tray is transferred, posture-changed, and tested. To achieve these operations, the inserts must have a mechanical configuration to stably receive the semiconductor devices. Such a configuration was already published in Korean Patent No. 10-0486412, entitled "TEST TRAY INSERT OF TEST HANDLER" that was filed by the applicant of this application (hereinafter, referred to as a 'cited application') and which is hereby incorporated by reference. As disclosed in the cited application, the inserts are configured to include a housing for receiving the semiconductor devices, a pair of stoppers for opening the insert as the stoppers rotate to release the insert at both the ends of the housing, and a pair of lockers elastically supported by compression springs, for preventing rotation of the stoppers and linearly being movable. Therefore, as long as the lockers do not overcome the elastic forces of the compression springs and move linearly to release the stoppers, in other words, as long as the inserts are not opened, the semiconductor devices cannot be received or separated by or from the housing.

However, when the loading apparatus 110 performs such a loading, the inserts must be opened to allow the housing to receive the semiconductor devices stably. Also, when the unloading apparatus 150 performs such an unloading, the insert must be opened to separate the semiconductor devices from the housing. Therefore, in order to open the inserts, the two insert-opening apparatus 160a and 160b, each correspondingly located at the lower sides of the loading apparatus 110 and unloading apparatus 150, must operate the lockers to release the stoppers, in which the test trays 11a and 11d are each sited between the insert-opening apparatus 160a and the loading apparatus 110 and between the insert-opening apparatus 160b and the unloading apparatus 150.

FIG. 2 is a schematic perspective view illustrating a conventional insert-opening apparatus (160a or 160b).

The conventional insert-opening apparatus (160a or 160b) includes a base plate 161, a base cylinder 162 for linearly transferring the base plate 161 toward a test tray, and four opening units 163a, 163b, 163c and 163d which are mounted on the base plate 161 in a 2×2 matrix form along the test tray direction. The four opening units 163a, 163b, 163c and 163d correspondingly include: plate openers 163a-1, 163b-1, 163c-1 and 163d-1, each of which occupies a quarter of the test tray and arrays a plurality of pairs of opening pins 163-1 in a 2×8 matrix form, which are integrally formed, in which the plat opener 163a-1, for example, opens the inserts in the quarter area allocated thereto simultaneously; and ascending/descending cylinders 163a-2 and 163c-2 for linearly transferring the plate openers 163a-1, 163b-1, 163c-1 and 163d-1 toward the test tray. Here, the plate openers are described as a 'site decision unit' in the cited application. On the other hand, FIG. 2 does not show ascending/descending cylinders for linearly transferring the plate openers 163b-1 and 163d-1.

The following is a description of operations of the conventional insert-opening apparatus 160a and 160b shown in FIG. 2.

Firstly, the base cylinder 162 transfers the base plate 161 closely to the test tray to secure a necessary distance for opening operations of the opening units 163a, 163b, 163c and 163d. After that, any one of the four opening units 163a, 163b, 163c and 163d, for example opening unit 163a, operates to open the inserts arrayed in the quarter area corresponding to the opening unit 163a. For example, when the ascending/descending cylinder 163a-2 transfers the plate opener 163a-1 toward the test tray, the pairs of opening pins 163-1 of the plate opener 163a-1 push and linearly transfer pairs of lockers mounted in each inserts, and rotate pairs of stoppers, thereby opening the insert.

As such, each of the four opening units 163a, 163b, 163c and 163d opens 16 inserts arrayed in ¼ area of the test tray, respectively, such that the whole inserts arrayed in the test tray can be opened. More specifically, the four opening units 163a, 163b, 163c and 163d operate sequentially as follows: for example, after the opening unit 163a opens the inserts arrayed in a quarter of the test tray allocated thereto and the semiconductor devices are loaded or separated in or from the opened inserts, the inserts are closed; and then, the opening unit 163b opens the inserts arrayed in another quarter of the test ray allocated thereto, and so on.

As such, the opening units 163a, 163b, 163c, and 163d are sequentially operated so as not to apply a relatively large force to the test tray, which may cause the test tray to bend. More specifically, when the four opening units are operated simultaneously, a relatively large force may be applied to the test tray, and when such a large force-applying state is maintained for a long time, the test tray may bend. Accordingly, a pick and place device including the loading apparatus 110 and unloading apparatus 150 should be configured to be light for a rapid processing speed and a rapid response speed. The pick and place apparatus is generally configured to adsorb and transfer no more than 16 semiconductor devices. Therefore, since it is enough that the inserts are opened in concert with a one-time processing capacity of the pick and place apparatus (as only the number of inserts corresponding to the one-time processing capacity is sequentially opened), the force applied to the test tray can be minimized to prevent the test tray from bending.

On the other hand, the test handler is tending to be developed to test a number of semiconductor devices at a time. Presently, a test tray arraying 32 or 64 inserts is commonly used, but, recently, a large-sized test tray having 128 or 160 inserts has been developed and will be sold on the market.

However, due to a structural restriction, the pick and place apparatus still has the capacity to test a maximum of 16 inserts. Therefore, in the case when a large-sized test tray is used, where 8 or 10 opening units should be installed, the production cost of the test handler would be increased.

Also, when the type of semiconductor devices to be tested is changed or new type of tester is applied to the test handler, the test tray must be replaced. In this case, additional work should be done, such as adjusting the distance between a pair of opening pins. Therefore, all of the opening units, etc., should be replaced, respectively. When 8 or 10 opening units are installed to a large-sized test tray, such replacement work requires a lot of time and increased replacement costs, and causes a waste of resources.

Also, when a large-sized test tray is applied, the pick and place apparatus should perform transferring and loading the semiconductor devices at positions corresponding to 8 or 10 opening units, respectively. With an increase of transferring points, jams occur frequently. When the pick and place apparatus performs a teaching (which means 'to measure' and 'to input' starting points and end points of movements of apparatuses driven by a motor), all positions corresponding to the 8 or 10 opening units should be applied. So the teaching will be difficult and take more time.

On the other hand, there is a waste of time in the loading part while a test tray is transferred. When a loading to test tray is completed, the base cylinder takes down the base plate to take down the insert-opening apparatus. After the loading-completed test tray is transferred to a rotator and confirmation is performed to insure that no test tray is in the loading part, another test tray is pushed to enter the lower side of the loading part. The insert-opening apparatus is lifted up to situate the test tray to a loading position, and then the opening units and the pick and place apparatus each perform a loading again. As such, since the pick and place apparatus should stop its operation during a time interval between a time point when one test tray completes its loading and a time point when another test tray starts its loading, the loading time is extended, which is disadvantageous in the conventional test handler.

SUMMARY OF THE INVENTION

The present invention has been made in view of the above problems and disadvantages, and it is an object of the present invention to provide a test handler which is operable in such a way that inserts, arrayed in a part of a test tray, are opened and then inserts, arrayed in another part of the test tray, are opened as the test tray is transferred.

In an exemplary embodiment of the present invention, the above object can be accomplished by the provision of a test handler comprising: a first loading member on which a plurality of semiconductor devices are loaded; a second loading member for loading the plurality of semiconductor devices; and a pick and place apparatus for transferring and supplying the semiconductor devices of the first loading member to the second loading member. Here, the second loading member repeatedly performs transfer and stop operations, in response to the semiconductor devices supplying operation of the pick and place apparatus such that the supplying position of the pick and place apparatus in relation to the second loading member is always substantially invariant.

In an exemplary embodiment, the test handler may further include: a transferring apparatus for transferring and stopping the second loading member; and an opening apparatus for assisting the pick and place apparatus to load the semiconductor devices to the second loading member.

In an exemplary embodiment, the second loading member may include at least one picking hole, and at least one sensing hole. The transferring apparatus may include a picking unit for picking the picking hole and a sensing unit for sensing the sensing hole. The opening apparatus may include a sensing unit for sensing the sensing hole.

In accordance with another aspect of the present invention, there is provided a test handler comprising: a test tray on which a plurality of inserts for loading at least one semiconductor device are arrayed; at least one opening unit for simultaneously opening one part of the plurality of inserts, which are arrayed on one part of the test tray; and a test tray transfer apparatus for transferring the test tray. Here, the opening unit may open simultaneously a plurality of inserts in one part of the test tray, and the test tray transfer apparatus may transfer the test tray to make the opening unit simultaneously open a plurality of inserts in another part of the test tray.

In an exemplary embodiment, the test handler may further include a pick and place apparatus for supplying the semiconductor devices to and withdrawing the semiconductor devices from the test tray. Here, the test tray transfer apparatus may transfer the test tray, regardless of operations of the pick and place apparatus.

In an exemplary embodiment, the test handler may further include a loading part for receiving the test tray and loading the semiconductor devices on the test tray. Here, the loading part may include the opening unit and the test tray transfer apparatus.

In an exemplary embodiment, the loading part includes a cover for covering most parts of the test tray received to the loading part. The cover forms an opening section for exposing a plurality of inserts arrayed on a part of the test tray. In an exemplary embodiment, the test tray includes: at least one picking hole formed at a part of the test tray; and at least one sensing hole formed at a part of the test tray.

In an exemplary embodiment, the picking hole is arrayed in a row in the proceeding direction of the test tray. The sensing hole may be arrayed in a row in the proceeding direction of the test tray.

In an exemplary embodiment, the opening unit includes: an opener for contacting and opening the plurality of inserts arrayed on the part of the test tray; and a linear transfer apparatus for transferring the opener to the plurality of inserts such that the opener can contact the plurality of inserts.

In an exemplary embodiment, the opening unit is formed as a module to be separably coupled to the test handler.

In an exemplary embodiment, the test tray transfer apparatus includes: a picking unit transferable in a state where it picks or unpicks the test tray; a first power source for supplying power for transfer of the picking unit; and a power transmission apparatus for transmitting the power from the first power source to the picking unit.

In an exemplary embodiment, the picking unit includes: a second power source for supplying power for picking and unpicking the test tray, being moved by the power transmitted from the power transmission apparatus; and a picking pin for picking and unpicking the test tray by with the power of the second power source.

BRIEF DESCRIPTION OF THE DRAWINGS

The above objects, features and other advantages of the present invention will be more clearly understood from the following detailed description taken in conjunction with the accompanying drawings, in which.

DESCRIPTION OF EXEMPLARY EMBODIMENTS

Detailed reference will now be made to exemplary embodiments of the present invention which are illustrated in the accompanying drawings.

Figure 7:
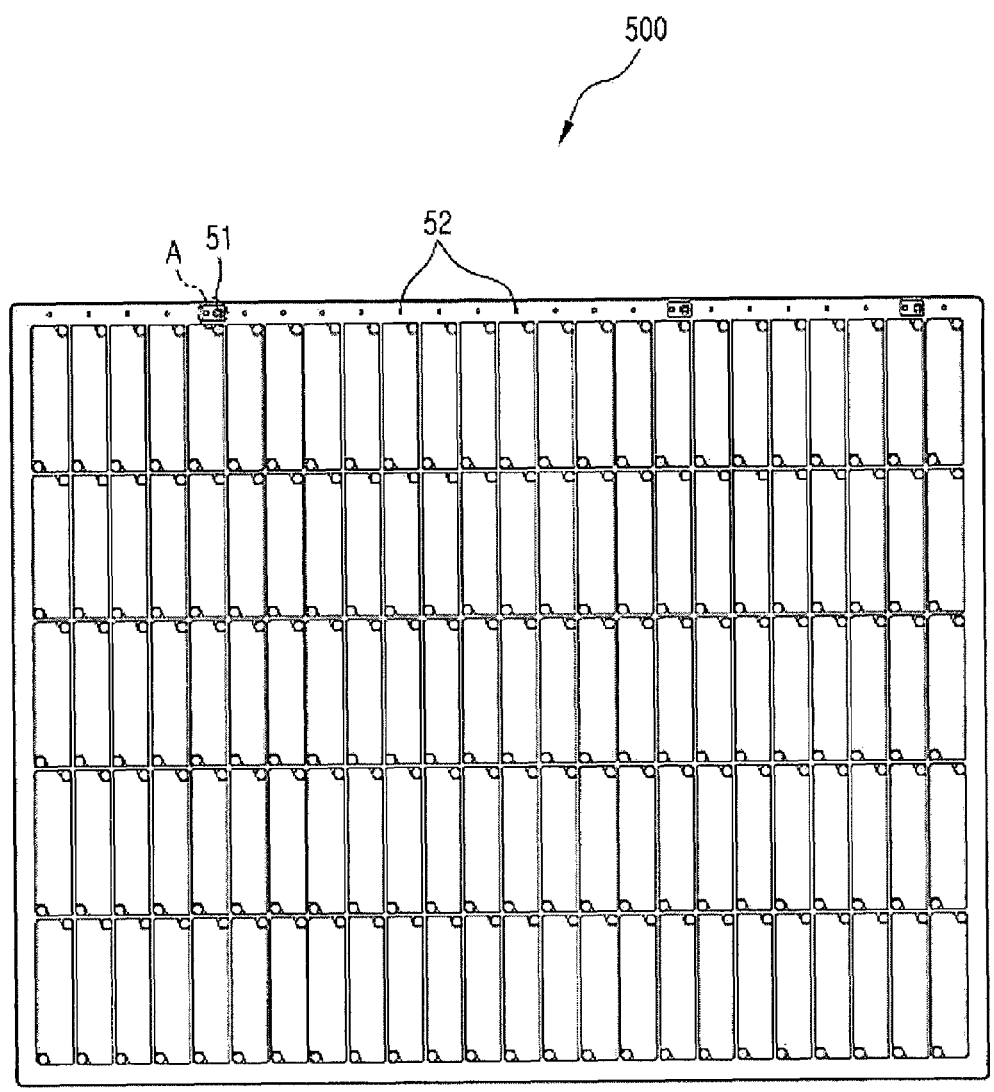
FIG. 7 is a top view of a test tray according to an exemplary embodiment of the present invention.

FIG. 7 is a top view illustrating a test tray according to an embodiment of the present invention. As shown in FIG. 7, a test tray 500 is configured to include a plurality of inserts (not shown), a plurality of picking holes 51, and a plurality of sensing holes 52.

The plurality of picking holes 51 correspond to picking pins 45 of a picking unit 400 of a test tray transfer apparatus 200 which will be described later, and allow the picking unit 400 to pick or unpick the test tray 500.

The plurality of sensing holes 52 correspond to a first position sensor 46 of the test tray transfer apparatus 200 and allow the first position sensor 46 to sense as to whether the picking pin 45 is precisely situated to couple to the picking hole 51. Also, the plurality of sensing holes 52 correspond to a second position sensor 33 of an insert-opening apparatus 300 which will be described later, and allow the second position sensor 33 to sense as to whether the test tray 500 is precisely situated to couple to the insert-opening apparatus 300.

Figure 8A:
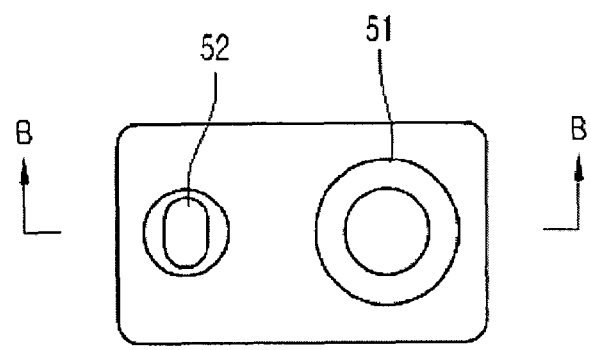
FIG. 8A is a partially enlarged view illustrating portion A of FIG. 7.
Figure 8B:
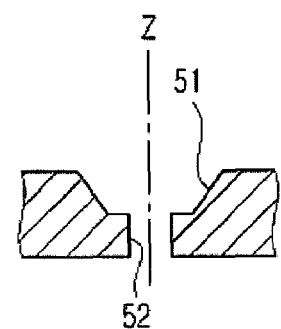
FIG. 8B is a cross-sectional view taken along lines B-B of FIG. 8A.
Figure 8C:
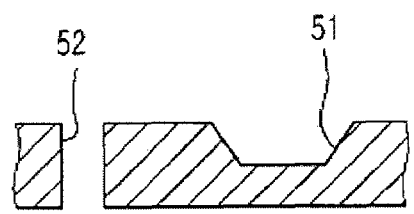
FIG. 8C is a cross-sectional view of an exemplary modification of FIG. 8B.

The test tray 500 is implemented in such way that the picking hole 51 and the sensing hole 52 are separately formed, as shown in FIG. 8A and FIG. 8B. Here, FIG. 8A is a partially enlarged view illustrating portion A of FIG. 7, and FIG. 8B is a cross-sectional view taken along lines B-B of FIG. 8A. Also, the test tray 500 may be implemented in such a way that the picking hole 51 and the sensing hole 52 are formed at the same axis Z, as shown in FIG. 8C illustrating a cross-sectional view of FIG. 8B.

Figure 1:
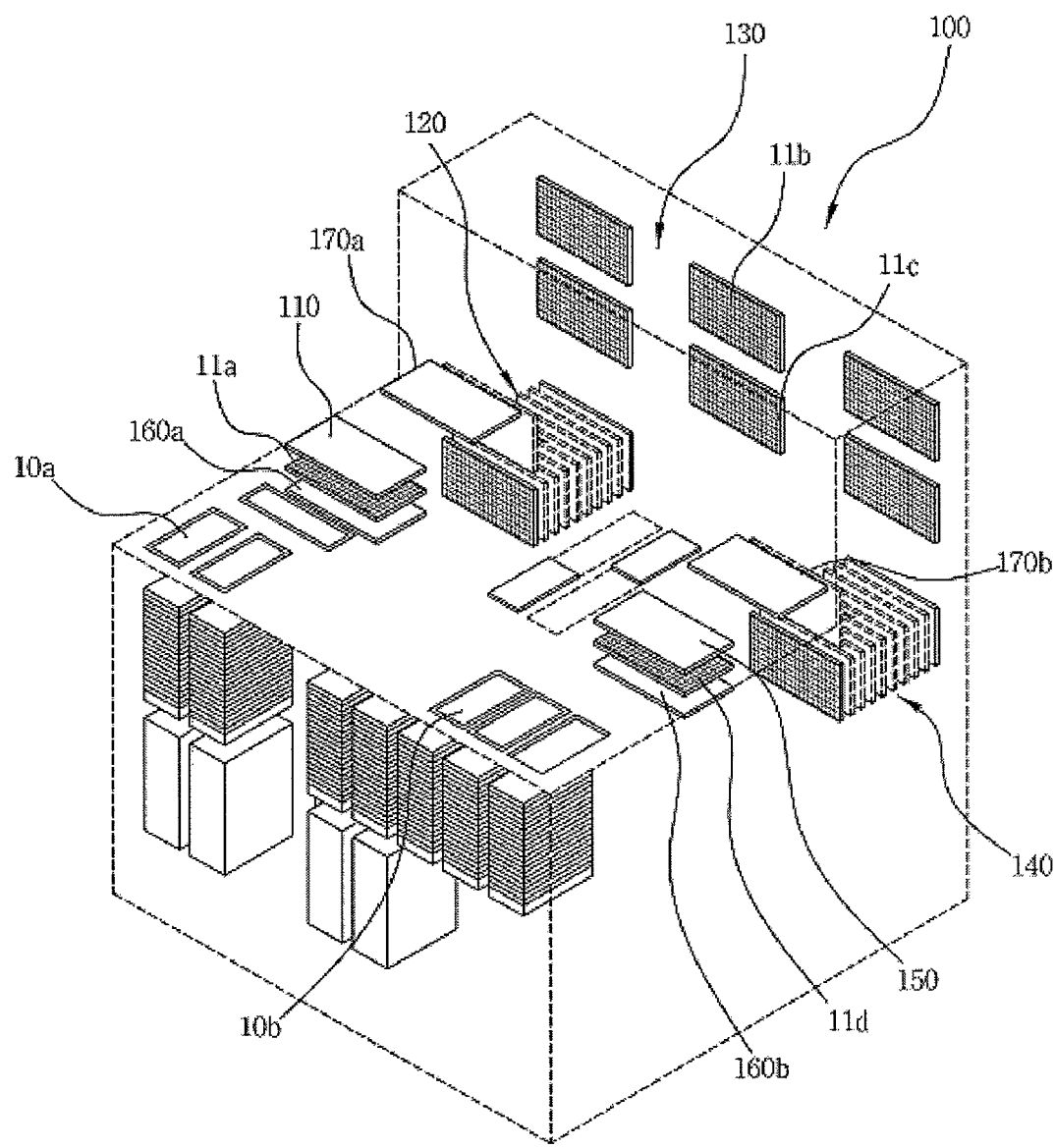
FIG. 1 is a schematic perspective view illustrating a conventional test handler.
Figure 2:
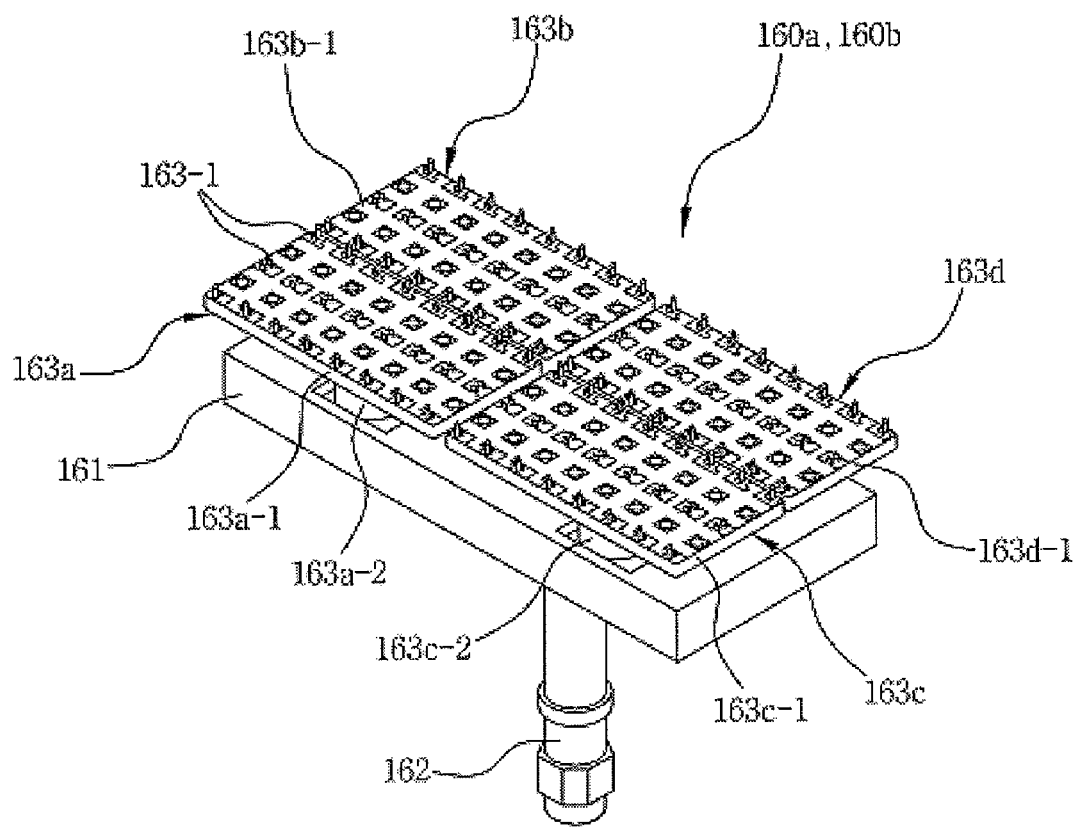
FIG. 2 is a schematic perspective view illustrating an insert-opening apparatus applied to the test handler of FIG. 1.
Figure 3:
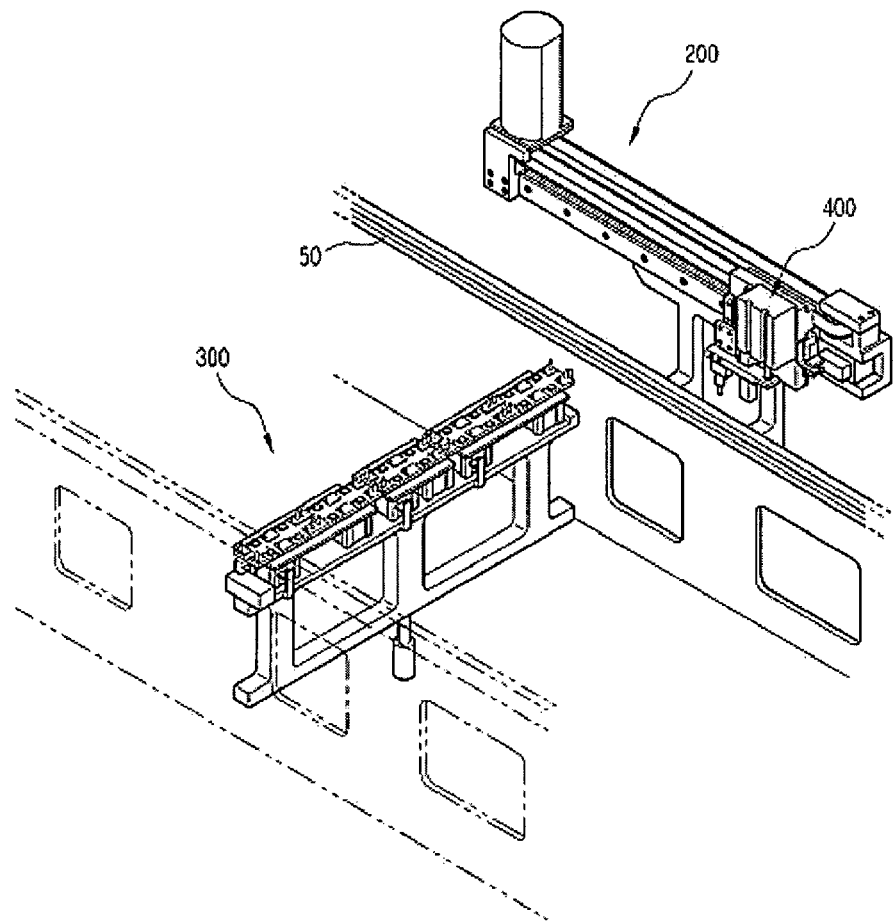
FIG. 3 is a schematic perspective view illustrating a loading part of a test handler according to an exemplary embodiment of the present invention, in which a cover and test trays are not shown.
Figure 5:
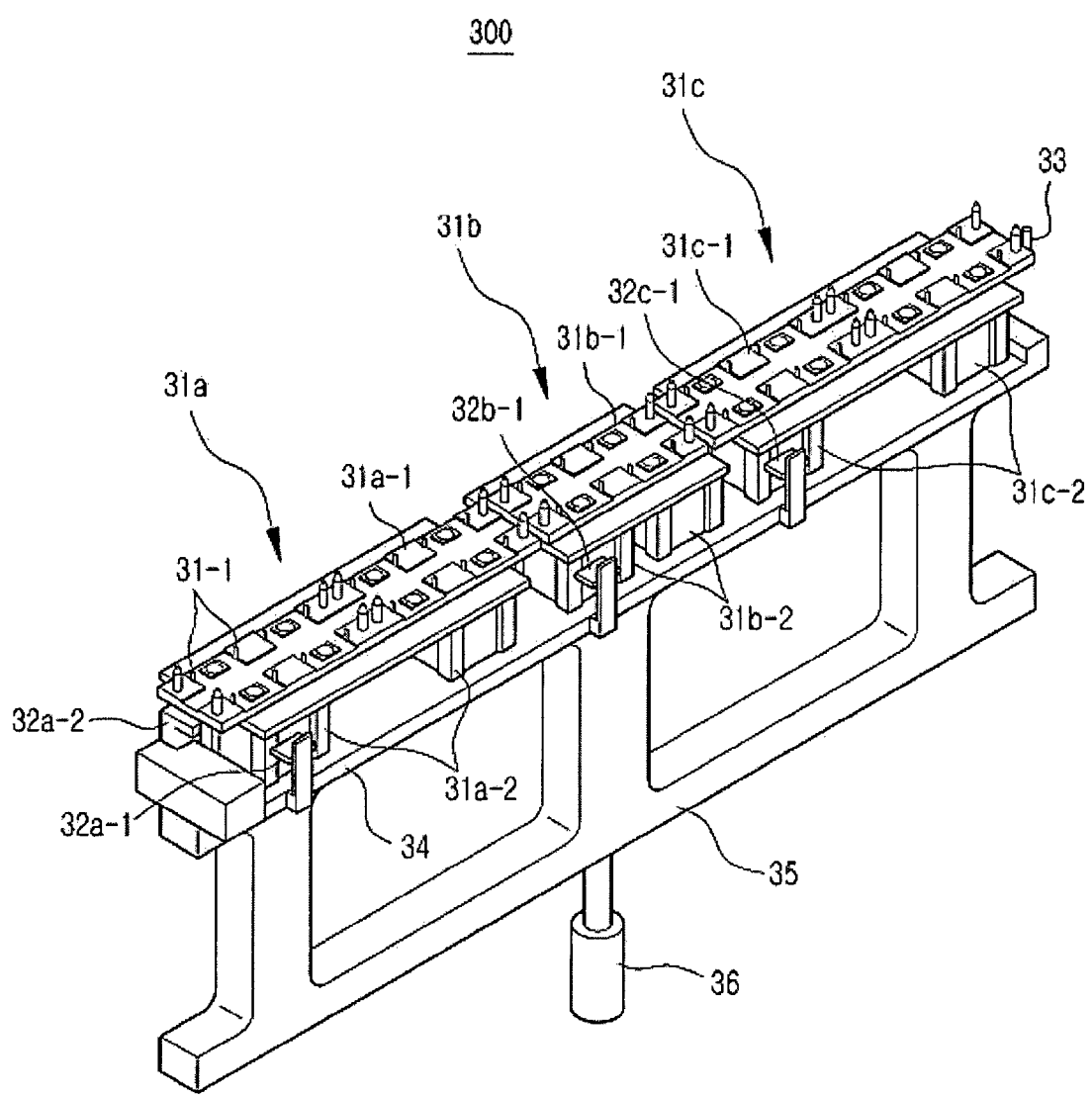
FIG. 5 is a schematic perspective view illustrating an exemplary insert-opening apparatus of FIG. 3.

FIG. 3 is a schematic perspective view illustrating a loading part of a test handler according to an embodiment of the present invention and FIG. 5 is a schematic perspective view illustrating the insert-opening apparatus 300 of FIG. 3. As shown in FIG. 3 and FIG. 5, the insert-opening apparatus 300 includes three opening units 31a, 31b and 31c, three upper limit sensors 32a-1, 32b-1, and 32c-1, three lower limit sensors 32a-2, 32b-2, and 32c-2 (reference numbers 32b-2 and 32c-2 are omitted since the lower limit sensors 32b-2 and 32c-2 do not appear in the figure), a second position sensor 33, a set plate 34, a base plate 35, and a base cylinder 36.

The three opening units 31a, 31b and 31c open inserts arrayed in a part of an area of the test tray 500, and include openers 31a-1, 31b-1, and 31c-1 and ascending/descending cylinders 31a-2, 31b-2, and 31c-2, correspondingly.

The openers 31a-1, 31b-1, and 31c-1 move linearly up and down with respect to the test tray 500. One side of the openers facing the test tray 500 each form pairs of opening pins 31-1 to open the inserts as pairs of lockers of the inserts are linearly moved.

Here, as shown in FIG. 3 and FIG. 5, each of the openers 31a-1 and 31c-1 forms 8 pairs of opening pins 31-1 to open 8 inserts, simultaneously. Also, the opener 31b-1 forms 4 pairs of opening pins 31-1 to open 4 inserts, simultaneously.

The ascending/descending cylinders 31a-2, 31b-2, and 31c-2 are each configured by a pair of cylinders which are fixedly installed onto the upper surface of the set plate 34 and transfer the respective openers 31a-1, 31b-1, and 31c-1 toward the test tray 500.

The three upper limit sensors 32a-1, 32b-1, and 32c-1 sense as to whether the respective openers 31a-1, 31b-1, and 31c-1 ascend up to their upper limit heights.

The three lower limit sensors 32a-2, 32b-2, and 32c-2 sense as to whether the respective openers 31a-1, 31b-1, and 31c-1 descend down to their lower limit heights.

The second position sensor 33 senses the sensing hole 52 of the test tray 500 to determine whether the test tray 500 is situated to couple to the insert-opening apparatus 300.

The set plate 34 may have the ascending/descending cylinders 31a-2, 31b-2, and 31c-2 fixedly installed on the upper surface thereof, which are lined up in a row, and the base plate 35 separably coupled to the lower surface thereof. Namely, the three opening units 31a, 31b, and 31c may be coupled to the set plate 34, thereby forming a module. Therefore, when the set plate 34 is separated from the base plate 35, the three opening units 31a, 31b, and 31c are separated at once.

The base plate 35 has the set plate 34 installed on its upper surface.

The base cylinder 36 is fixed to a loading part of the test handler to take up/down the base plate 35.

Figure 6A:
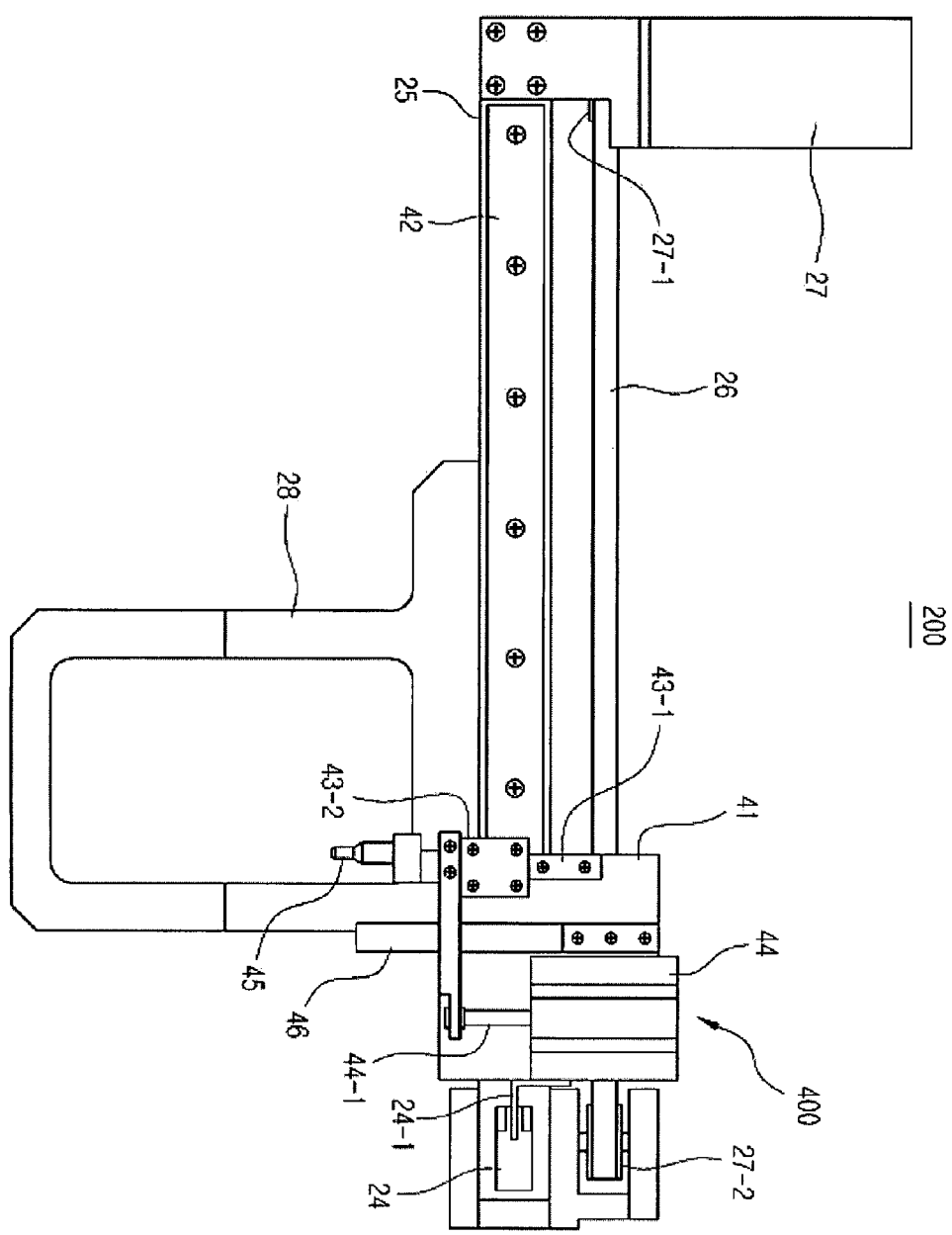
FIG. 6A is a front view of an exemplary test tray transfer apparatus of FIG. 3.
Figure 6B:
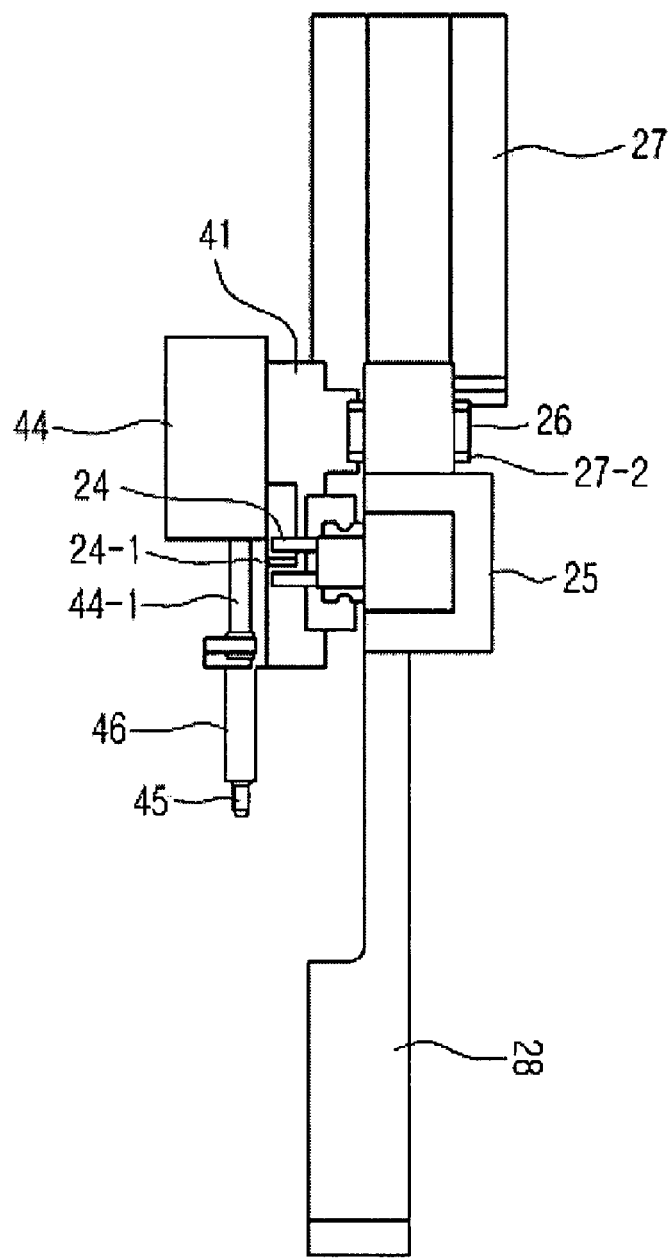
FIG. 6B is a side view of an exemplary test tray transfer apparatus of FIG. 3.

As shown in FIG. 6A and FIG. 6B, each illustrating a front view and a side view of a test tray transfer apparatus of FIG. 3, the test tray transfer apparatus 200 transfers the test tray 500 such that the relative position of the test tray 500 can be changed with respect to the insert-opening apparatus 300. The test tray transfer apparatus 200 includes a picking unit 400, a motor 27 having a driving pulley 27-1, a rotation belt 26 attached between the driving pulley 27-1 and a driven pulley 27-2, an origin sensor 24, a mounting block 25, a first LM guide 42, and a base block 28.

The picking unit 400 moves in picking or un-picking the test tray 500. The picking unit 400 includes a transfer block 41, an ascending/descending cylinder 44, a second LM guide 43-1, a second LM guide block 43-2, a picking pin 45, a first position sensor 46, and an origin sensor pin 24-1.

The transfer block 41 is engaged with the rotation belt 26. The transfer block 41 is guided by the first LM guide 42, and moved by the motor 27.

The ascending/descending cylinder 44 takes up/down an ascending/descending cylinder rod 44-1 to provide operation power to pick or unpick the test tray 500.

The second LM guide 43-1 and the second LM guide block 43-2 guide parts of the picking unit 400 as the ascending/descending cylinder rod 44-1 ascends/descends.

The picking pin 45 descends toward the test tray 500 according to descent of the ascending/descending cylinder rod 44-1 and is inserted to the picking hole 51 of the test tray 500, thereby picking the test tray 500. The picking pin 45 moves as the motor 27 is driven, in picking the test tray 500. As the ascending/descending cylinder rod 44-1 ascends, the picking pin 45 also ascends and unpicks the test tray 500.

The first position sensor 46 senses positions of the picking holes 51 and the sensing holes 52 to determine as to whether the picking pins 45 are precisely situated to couple to the picking holes 51.

The origin sensor pin 24-1 is formed to allow the origin sensor 24 to sense the initial position of the picking unit 400.

The motor 27 is fixed to the mounting block 25 to provide power for driving the picking unit 400. The motor 27 can rotate in forward and reverse directions. The motor 27 may be implemented by a step motor or a servo motor to easily control the position of the picking unit 400.

The rotation belt 26 transmits driving force of the motor 27 to the picking unit 400, and is attached between the driving pulley 27-1 installed to the motor 27 and the driven pulley 27-2 installed opposite to the driving pulley 27-1 on the mounting block 25.

The origin sensor 24 senses the initial position of the picking unit 400 with the origin sensor pin 24-1 of the picking unit 400.

The first LM guide 42 is installed to be engaged with the picking unit 400 and guides the picking unit 400.

The mounting block 25 installs the motor 27, the driven pulley 27-2, the origin sensor 24, and the first LM guide 42 thereto.

The mounting block 25 is fixed to the base block 28. The base block 28 couples its lower side to the side wall of the loading part of the test handler.

Figure 4:
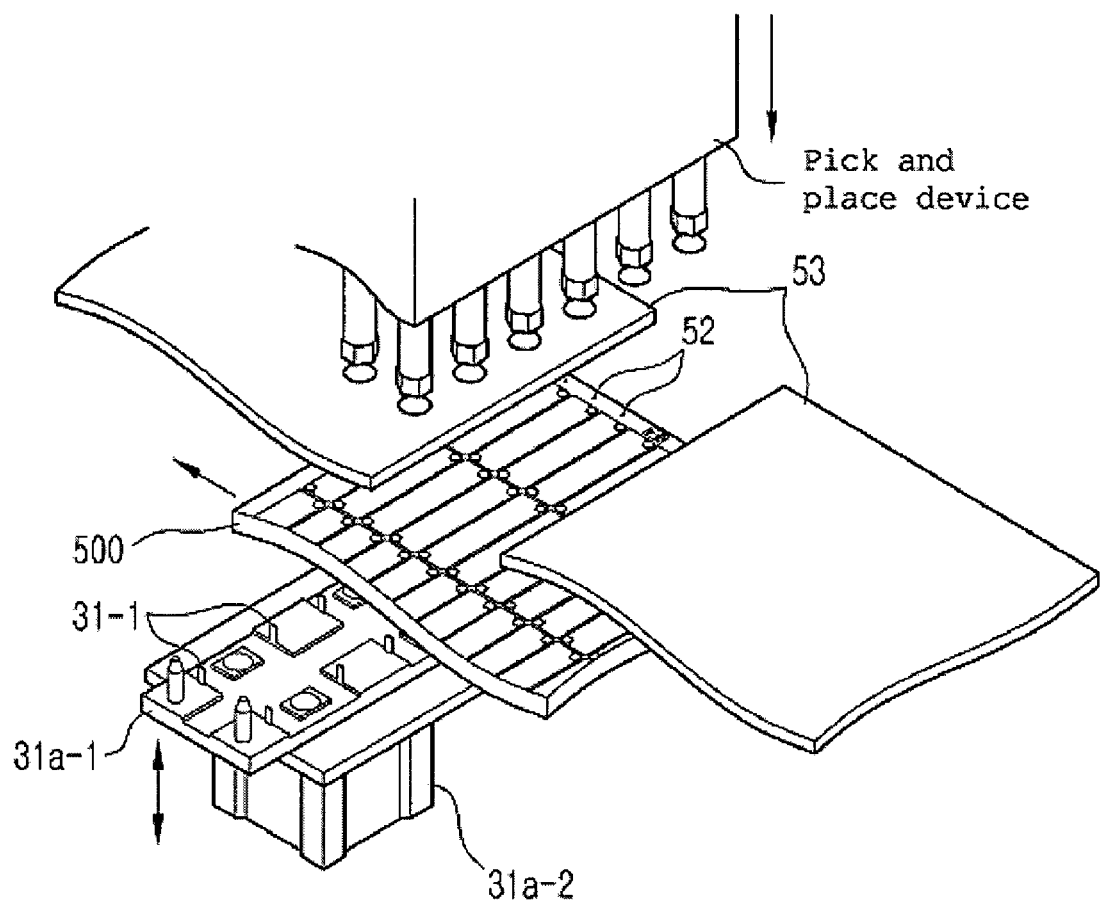
FIG. 4 is a schematic view illustrating an exemplary pick and place apparatus, a cover, a test tray, and an insert-opening-apparatus.

Although FIG. 3 is shown in such a way to entirely expose the loading part, only a part of upper portion of the insert-opening apparatus 300 and a space for movement of the picking pin 45 may be opened because the other portions may be covered by a cover 53 (refer to FIG. 4 of a schematic view illustrating a pick and place-apparatus, a cover, test trays, and an insert-opening-apparatus). Here, the covered portions may be utilized by installation of other members.

The following is a description of the loading part of the test handler according to an exemplary embodiment of the present invention, referring to FIGS. 9A to 9H. FIG. 9A to 9H are views describing operation states of the test tray transfer apparatus of FIG. 3.

Figure 9A:
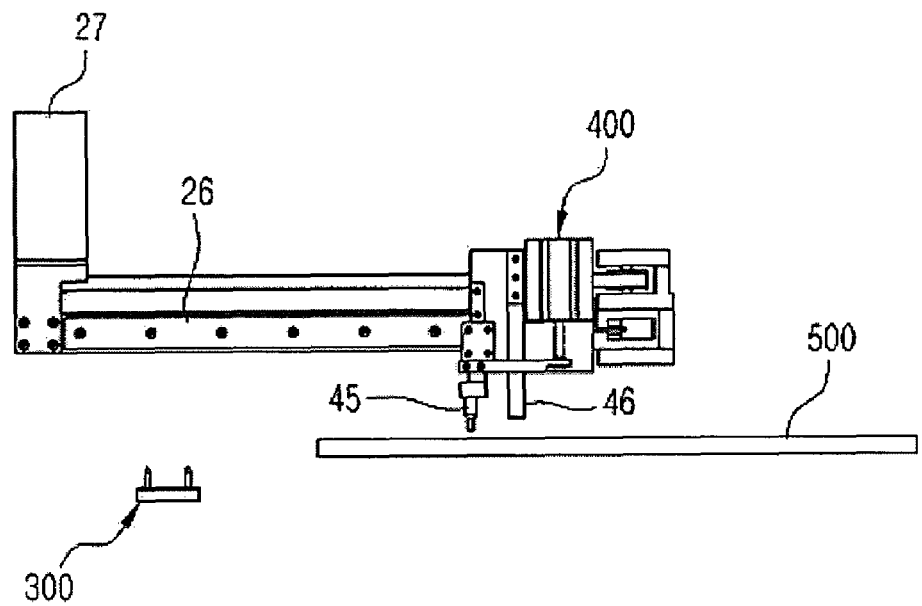
FIG. 9A to FIG. 9H are views for describing exemplary operation states of the test tray transfer apparatus of FIG. 3.
Figure 9B:
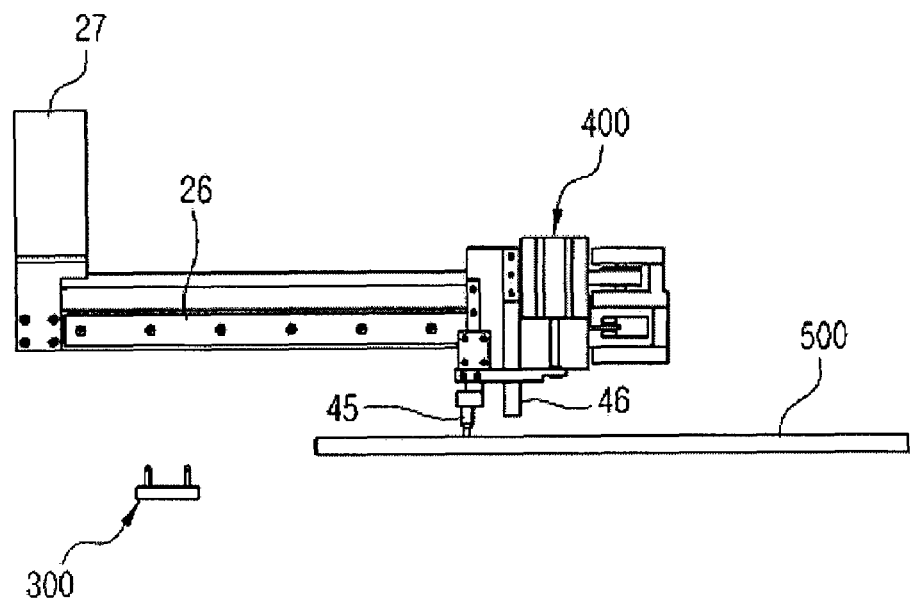

Firstly, the test tray 500 is placed on the guide rail 50 of FIG. 3, as shown in FIG. 9A. The initial position of the test tray is detected by the origin sensor 24 and the origin sensor pin 24-1, and the first position sensor 46 and the sensing hole 52. When the picking pin 45 is situated at a certain position, the ascending/descending cylinder 44 of the picking unit 400 is operated such that the picking pin 45 can be descended and inserted to the picking hole 51 of the test tray 500. As a result, the picking unit 400 picks the test tray 500 as shown in FIG. 9B.

After that, the motor 27 of the test tray transfer apparatus 200 is driven. The driving pulley 27-1 is driven as the motor 27 rotates forwardly (for example, in a clockwise direction). The power of the motor 27 is transmitted to the picking unit 400 through the belt 26 such that the picking unit 400 can move to the left in FIG. 9B. The test tray 500 is transferred to the left such that the inserts of the first two columns of the test tray 500 (two columns in the length-wise direction shown in FIG. 7) can be situated above the insert-opening apparatus 300 and be ready to be loaded the semiconductor devices, as shown in FIG. 9C.

Figure 9C:
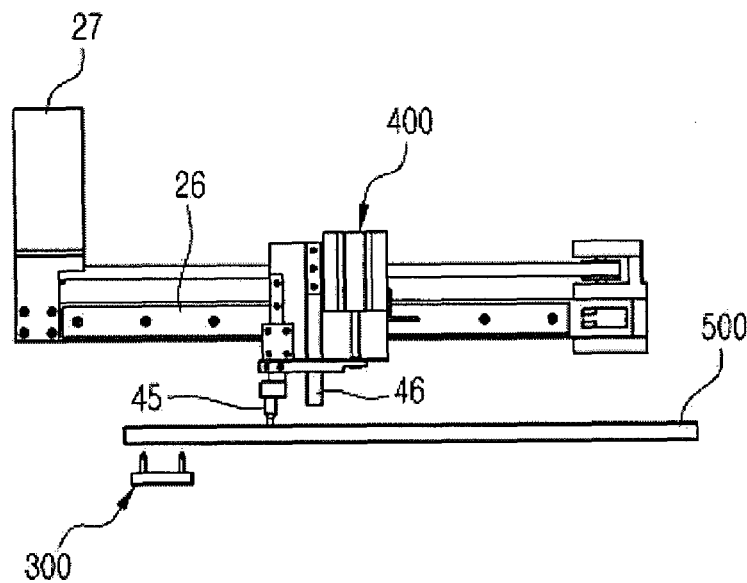

In the state of FIG. 9C, the second position sensor 33 of the insert-opening apparatus 300 senses the sensing hole 52 of the test tray 500 to determine as to whether the test tray 500 is situated at a certain position. When the test tray 500 is situated at the certain position, the insert-opening apparatus 300 is operated. As the ascending/descending cylinders 31a-2, 31b-2 and 31c-2 of the insert-opening apparatus 300 are operated, the openers 31a-1, 31b-1, and 31c-1 are lifted up toward the test tray 500 (the upper direction). As a total of 20 opening pins 31-1 formed on the openers 31a-1, 31b-1, and 31c-1 push corresponding stoppers and lockers of the inserts, the 20 inserts are opened simultaneously. At this stage, the pick and place apparatus (referring to FIG. 4) supplies and loads the 20 picked semiconductor devices to the 20 opened inserts. When the semiconductor devices are loaded, the ascending/descending cylinders 31a-2, 31b-2, and 31c-2 take down the openers 31a-1, 31b-1, and 31c-1 and then the inserts are closed. Since typical operation of the an insert-opening apparatus is publicly well-known, the illustration thereof is omitted in the drawings.

After that, as the motor 27 is operated, the test tray 500 is transferred by two columns of the inserts (two columns in the length-wise direction shown in FIG. 7).

Afterwards, the above-described processes (sensing by the second position sensor 33; ascending by the openers 31a-1, 431b-1 and 31c-1; loading by the pick and place apparatus; descending by the openers 31a-1, 3b-1, and 31c-1; and transferring of the test tray 500 by the motor 27, which are hereinafter referred to as 'process A') are repeated.

Figure 9D:
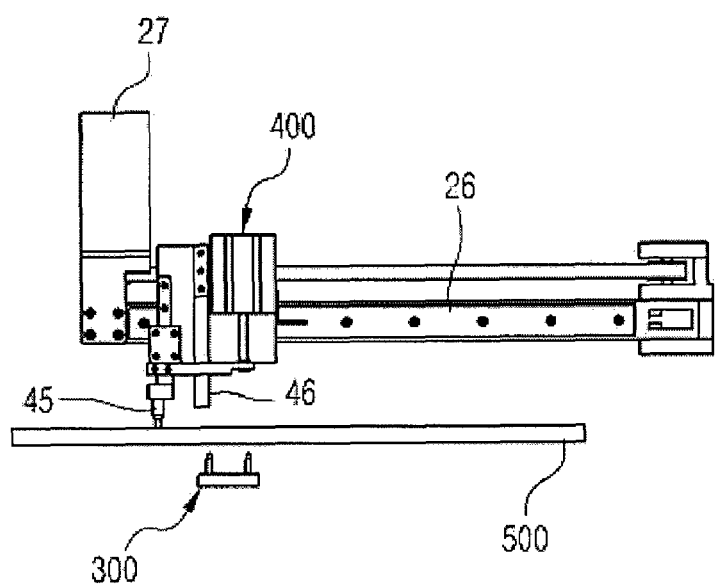
Figure 9E:
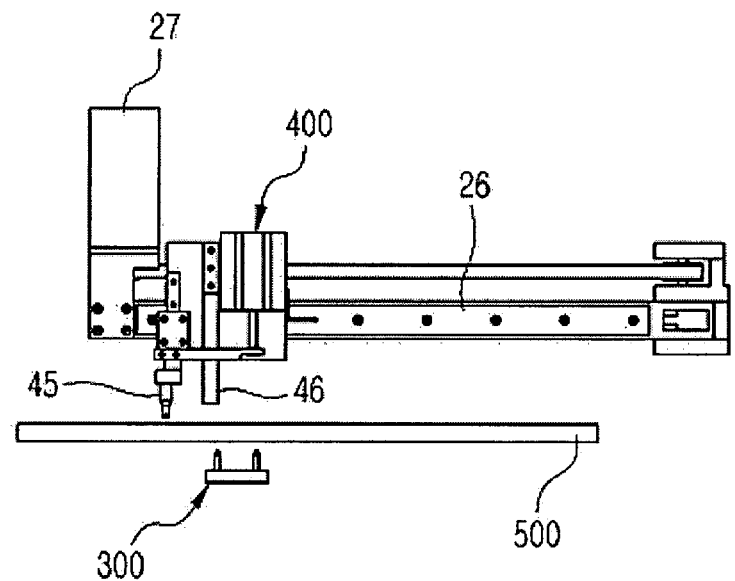

As shown in FIG. 9D, process A stops when the picking unit 400 arrives at the left limit of the test tray transfer apparatus 200. When the ascending/descending cylinder 44 of the picking unit 400 takes up the picking pin 45, the picking unit 400 unpicks the test tray 500 as shown in FIG. 9E.

Figure 9F:
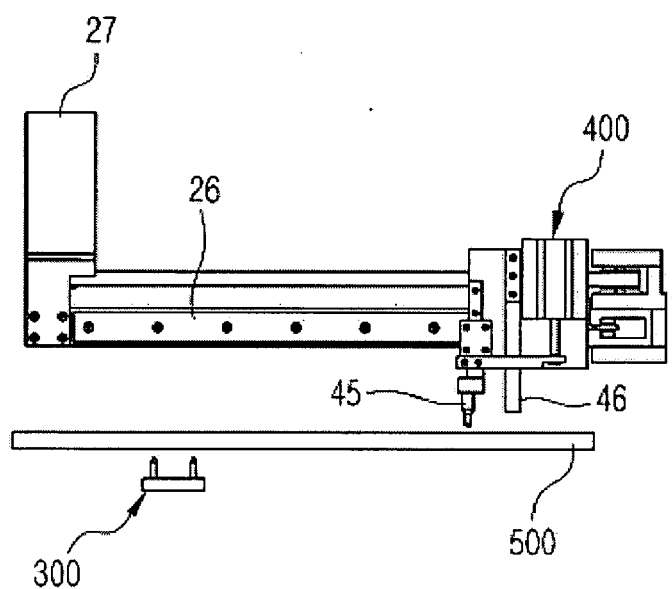

The picking unit 400 unpicking the test tray 500 is transferred to the right by the operation of the motor 27 such that the picking pin 45 is situated to another picking hole 51 as shown in FIG. 9F.

The picking unit 400 picks the test tray 500 by the operation of the ascending/descending cylinder 44 and then the process A is repeated.

Figure 9G:
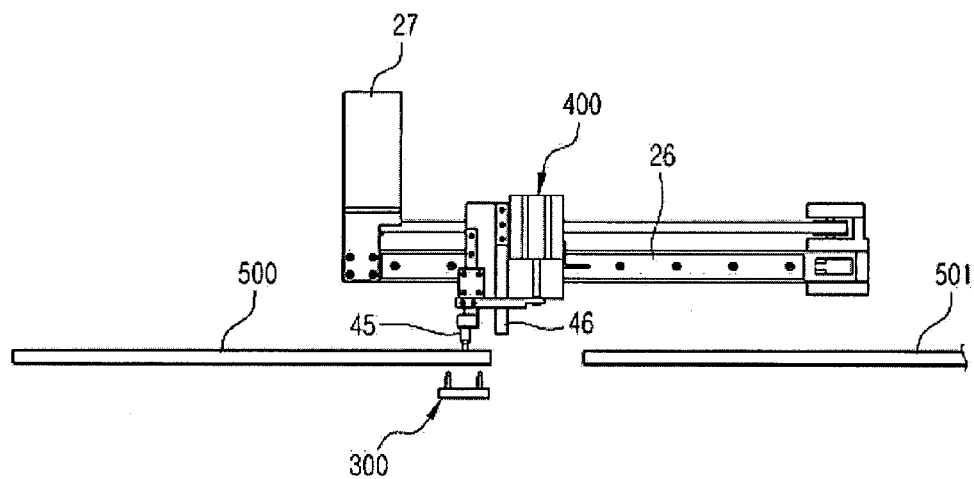
Figure 9H:
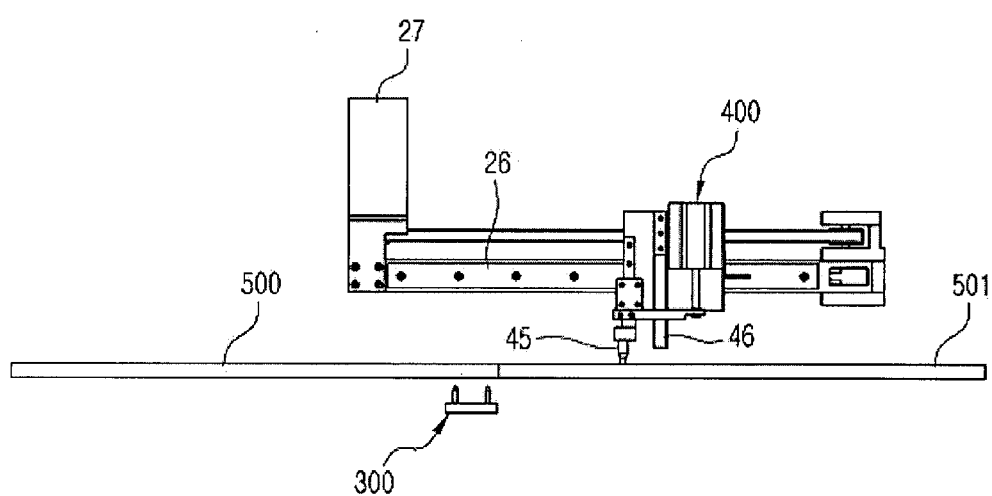

As shown in FIG. 9G, before the semiconductor devices are loaded to the last two columns of the inserts of the test tray 500, a buffer ascending/descending apparatus (not shown) takes up a following test tray 501 and places it on the guide rail 50.

The test tray transfer apparatus 200 un-picks the test tray 500 and returns to its initial position. The origin sensor 24 and first position sensor 46 sense the initial position to allow the test tray transfer apparatus 200 to pick a following test tray 501 (like the processes illustrated in FIG. 8A and FIG. 8B). The following test tray 501 is transferred upward the insert-opening apparatus 300. Here, the foregoing test tray 500 situated at the last loading position is pushed out by a following test tray 501 as shown in FIG. 8H. After that, the test tray 500 is transferred to another part (for example, a chamber or a rotator). The loading part keeps on loading the following test tray 501. As a result, since the foregoing test tray 500 and the following test tray 501 are continuously loaded without a time interval, the loading time can be reduced.

When the semiconductor devices to be tested change size, replacement work of the test tray is performed in such a way that: the transfer value (which corresponds to the two columns of the inserts in the lengthwise direction in FIG. 7) of the test tray transfer apparatus 200 must be modified; the base cylinder 36 of the insert-opening apparatus 300 is operated to move the base plate 35 upward; the set plate 34 is separated; and a set plate to which opening units corresponding to a newly replaced test tray are installed is coupled thereto.

The test tray transfer apparatus 200 may be implemented in such a way that it can be repeatedly and reciprocately operated by an inputted transfer value. Namely, the test tray transfer apparatus 200 may repeat the following processes: picking the test tray 500 by the picking unit 400; transferring the test tray 500 based on the inputted transfer value; unpicking the test tray 500 by the picking unit 400; and returning of the picking unit 400 based on the inputted transfer value.

The test tray transfer apparatus 200 may be variously modified from the exemplary embodiment in such a way that it can transmit power of the motor to the picking unit 400 through a screw shaft and screw nuts instead of the rotation belt, or it can change the position of the picking unit 400 using a cylinder instead of the motor as a power source.

Although the foregoing description described the present invention as applied to a loading part, the present invention can be adapted to an unloading or other parts as well.

As described above, according to the present invention, all of the inserts of the test tray can be operated by the insert-opening apparatus arrayed in a part of an area of the test tray as the test tray is transferred. Therefore, the test handler according to the present invention can reduce the number of components, thereby decreasing its manufacturing costs, and maintenance costs accompanied with replacement work. Also, a plurality of opening units may be integrated to form a module as they are coupled to a set plate, and thus the module is separably coupled to the test handler. Therefore, the replacement work of the test tray can be easily performed and the replacement work time can be reduced. Also, such a module can be easily applied to various types of testers.

By improving the transferring process of the test tray in the loading part, the time interval between a loading completion time point of a test tray and a loading start time point of a following test tray can be greatly reduced. As a result, the loading time of the semiconductor devices can be reduced.

Also, as the loading part reduces its exposed portion, it prevents foreign matter including the semiconductor devices from falling onto the test tray. In addition, the space formed by covering the loading part can dispose other parts, and the volume of the test handler is reduced.

Furthermore, by reducing the moving point of the pick and place apparatus, jams can be reduced, teaching work can be easily performed, and teaching time can be reduced.

Although the exemplary embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A test handler comprising:
   a test tray on which a plurality of inserts for loading at least one semiconductor device are arrayed;
   at least one opening unit for simultaneously opening one part of the plurality of inserts, which are arrayed on one part of the test tray; and
   a test tray transfer apparatus for transferring the test tray;
   wherein the opening unit simultaneously opens a plurality of inserts in one part of the test tray, and the test tray transfer apparatus transfers the test tray to cause the opening unit to simultaneously open a plurality of inserts in another part of the test tray.

2. The test handler according to claim 1, further comprising a pick and place apparatus for supplying the semiconductor devices to and withdrawing the semiconductor devices from the test tray,
   wherein the test tray transfer apparatus transfers the test tray regardless of operations of the pick and place apparatus.

3. The test handler according to claim 1, further comprising a loading part for receiving the test tray and loading the semiconductor devices on the test tray,
   wherein the loading part includes the opening unit and the test tray transfer apparatus.

4. The test handler according to claim 3, wherein:
   the loading part includes a cover for covering most parts of the test tray received to the loading part, wherein
   the cover forms an opening section for exposing a plurality of inserts arrayed on a part of the test tray.

5. The test handler according to claim 1, wherein the test tray includes:
   at least one picking hole formed at a part of the test tray; and
   at least one sensing hole formed at a part of the test tray.

6. The test handler according to claim 5, wherein:
   the at least one picking hole is arrayed in a row in a proceeding direction of the test tray; and
   the at least one sensing hole is arrayed in a row in the proceeding direction of the test tray.

7. The test handler according to claim 1, wherein the opening unit includes:
   an opener for contacting and opening the plurality of inserts arrayed on the part of the test tray; and
   a linear transfer apparatus for transferring the opener to the plurality of inserts such that the opener can contact the plurality of inserts.

8. The test handler according to claim 7, wherein the opening unit is formed as a module to be separably coupled to the test handler.

9. The test handler according to claim 1, wherein the test tray transfer apparatus includes:
   a picking unit transferable in a state where it picks or unpicks the test tray;
   a first power source for supplying power for transfer of the picking unit; and
   a power transmission apparatus for transmitting the power from the first power source to the picking unit.

10. The test handler according to claim 9, wherein the picking unit includes:
    a second power source for supplying power for picking and unpicking the test tray being moved by the power transmitted from the power transmission apparatus; and
    a picking pin for picking and unpicking the test tray with the power of the second power source.

* * * * *